(12) United States Patent  
Nguyen et al.

(10) Patent No.: US 9,293,448 B2  
(45) Date of Patent: Mar. 22, 2016

(54) METHODS OF FORMING THREE-DIMENSIONALLY INTEGRATED SEMICONDUCTOR SYSTEMS INCLUDING PHOTOACTIVE DEVICES AND SEMICONDUCTOR-ON-INSULATOR SUBSTRATES

(71) Applicant: Soitec, Crolles Cedex (FR)

(72) Inventors: Bich-Yen Nguyen, Austin, TX (US); Mariam Sadaka, Austin, TX (US)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/474,503

(22) Filed: Sep. 2, 2014

(65) Prior Publication Data

US 2014/0369646 A1 Dec. 18, 2014

Related U.S. Application Data

(62) Division of application No. 13/206,299, filed on Aug. 9, 2011, now Pat. No. 8,842,945.

(51) Int. Cl.
*G02B 6/12* (2006.01)
*H01L 25/16* (2006.01)
(Continued)

(52) U.S. Cl.
CPC .......... *H01L 25/167* (2013.01); *G02B 6/12002* (2013.01); *G02B 6/12004* (2013.01); *H01L 27/0688* (2013.01); *H01L 27/1203* (2013.01);
(Continued)

(58) Field of Classification Search
CPC ................. H01L 2924/00; H01L 2924/00014; H01L 2224/32225; G02B 6/43; G02B 6/4214; G02B 6/12

USPC ......................................... 385/1, 2, 4, 8, 9, 14
See application file for complete search history.

(56) References Cited

U.S. PATENT DOCUMENTS 6,303,468 B1 10/2001 Aspar et al.
6,335,258 B1 1/2002 Aspar et al.
(Continued)

FOREIGN PATENT DOCUMENTS

FR 2812405 A1 2/2002

OTHER PUBLICATIONS

Bakir et al., 3D Heterogeneous Integrated Systems: Liquid Cooling, Power Delivery, and Implementation, IEEE 2008 Custom Integrated Circuits Conference (CICC), pp. 663-670.

(Continued)

*Primary Examiner* — Jennifer Doan
(74) *Attorney, Agent, or Firm* — TraskBritt

(57) ABSTRACT

Three-dimensionally integrated semiconductor systems include a photoactive device operationally coupled with a current/voltage converter on a semiconductor-on-insulator (SeOI) substrate. An optical interconnect is operatively coupled to the photoactive device. A semiconductor device is bonded over the SeOI substrate, and an electrical pathway extends between the current/voltage converter and the semiconductor device bonded over the SeOI substrate. Methods of forming such systems include forming a photoactive device on an SeOI substrate, and operatively coupling a waveguide with the photoactive device. A current/voltage converter may be formed over the SeOI substrate, and the photoactive device and the current/voltage converter may be operatively coupled with one another. A semiconductor device may be bonded over the SeOI substrate and operatively coupled with the current/voltage converter.

24 Claims, 6 Drawing Sheets

(51) Int. Cl.
*H01L 31/103* (2006.01)
*H01L 27/06* (2006.01)
*H01L 27/12* (2006.01)
*H01L 33/34* (2010.01)

(52) U.S. Cl.
CPC .............. *H01L 31/103* (2013.01); *H01L 33/34* (2013.01); *H01L 2924/0002* (2013.01)

(56) References Cited

U.S. PATENT DOCUMENTS

| | | | |
|---|---|---|---|
| 6,635,543 B2 * | 10/2003 | Furukawa et al. | 438/311 |
| 6,756,286 B1 | 6/2004 | Moriceau et al. | |
| 6,809,044 B1 | 10/2004 | Aspar et al. | |
| 6,910,809 B2 | 6/2005 | Cheng | |
| 6,946,365 B2 | 9/2005 | Aspar et al. | |
| 6,949,768 B1 * | 9/2005 | Anderson et al. | 257/74 |
| RE39,484 E | 2/2007 | Bruel | |
| 7,257,283 B1 | 8/2007 | Liu et al. | |
| 7,679,728 B2 | 3/2010 | Kurokawa | |
| 7,936,448 B2 | 5/2011 | Albuquerque et al. | |
| 8,481,406 B2 | 7/2013 | Sadaka et al. | |
| 2005/0094926 A1 | 5/2005 | Dominic et al. | |
| 2005/0100345 A1 | 5/2005 | Welch et al. | |
| 2005/0108664 A1 | 5/2005 | Johnston et al. | |
| 2005/0111848 A1 | 5/2005 | Grubb et al. | |
| 2005/0129350 A1 | 6/2005 | Welch et al. | |
| 2005/0135729 A1 | 6/2005 | Welch et al. | |
| 2005/0135731 A1 | 6/2005 | Welch et al. | |
| 2005/0169640 A1 | 8/2005 | Grubb et al. | |
| 2005/0213883 A1 | 9/2005 | Welch et al. | |
| 2006/0018587 A1 | 1/2006 | Lakshminarayana et al. | |
| 2006/0062519 A1 | 3/2006 | Kish et al. | |
| 2006/0093369 A1 | 5/2006 | Nagarajan | |
| 2006/0159387 A1 | 7/2006 | Handelman | |
| 2006/0159411 A1 | 7/2006 | Miller | |
| 2006/0177173 A1 | 8/2006 | Shastri et al. | |
| 2006/0182441 A1 | 8/2006 | Kish et al. | |
| 2006/0228067 A1 | 10/2006 | Joyner et al. | |
| 2006/0239612 A1 | 10/2006 | De Dobbelaere et al. | |
| 2006/0245754 A1 | 11/2006 | Valette | |
| 2006/0251426 A1 | 11/2006 | Mazed | |
| 2007/0019901 A1 | 1/2007 | Kish et al. | |
| 2007/0086702 A1 | 4/2007 | Peters et al. | |
| 2007/0172169 A1 | 7/2007 | Kish et al. | |
| 2007/0183737 A1 | 8/2007 | Joyner | |
| 2007/0183738 A1 | 8/2007 | Welch et al. | |
| 2007/0242919 A1 | 10/2007 | Welch et al. | |
| 2007/0248299 A1 | 10/2007 | Welch et al. | |
| 2007/0269160 A1 | 11/2007 | Handelman | |
| 2007/0269214 A1 | 11/2007 | Handelman | |
| 2007/0269220 A1 | 11/2007 | Handelman | |
| 2007/0269221 A1 | 11/2007 | Handelman | |
| 2007/0274630 A1 | 11/2007 | Ghiron et al. | |
| 2008/0013881 A1 | 1/2008 | Welch et al. | |
| 2008/0025726 A1 | 1/2008 | Welch et al. | |
| 2008/0031626 A1 | 2/2008 | Welch et al. | |
| 2008/0037928 A1 | 2/2008 | Handelman | |
| 2008/0138088 A1 | 6/2008 | Welch et al. | |
| 2009/0022452 A1 | 1/2009 | Welch et al. | |
| 2009/0092354 A1 | 4/2009 | Joyner | |
| 2009/0154917 A1 | 6/2009 | Handelman | |
| 2009/0202196 A1 | 8/2009 | Kish, Jr. et al. | |
| 2009/0220191 A1 | 9/2009 | Evans et al. | |
| 2009/0238557 A1 | 9/2009 | Chen et al. | |
| 2009/0245719 A1 | 10/2009 | Nagarajan et al. | |
| 2009/0245795 A1 | 10/2009 | Joyner et al. | |
| 2009/0257706 A1 | 10/2009 | Rasras | |
| 2009/0317033 A1 | 12/2009 | Shih et al. | |
| 2010/0183043 A1 | 7/2010 | Rigole et al. | |
| 2010/0247028 A1 | 9/2010 | Nagarajan et al. | |
| 2010/0254420 A1 | 10/2010 | Corzine et al. | |
| 2010/0290735 A1 | 11/2010 | Joyner et al. | |
| 2013/0039615 A1 | 2/2013 | Nguyen et al. | |

OTHER PUBLICATIONS

Bakir et al., Electrical, Optical, and Fluidic Interconnect Networks for 3D Heterogeneous Integrated Systems, IEEE 2008, 978-1-4244-1920-3, pp. 7-8.
Bakir et al., Revolutionary NanoSilicon Ancillary Technologies for Ultimate-Performance Gigascale Systems, IEEE 2007 Custom Integrated Circuits Conference (CICC), pp. 421-428.
King, Jr. et al., 3D Stacking of Chips with Electrical and Microfluidic I/O Interconnects, 2008 Electronic Components and Technology Conference, pp. 1-7.
Liu et al., Ge-on-Si Laser Operating at Room Temperature, Optics Letters, Vo. 35, No. 5, Mar. 1, 2010, pp. 679-681.
Luduc et al., First Integration of Cu TSV Using Die-to-Wafer Direct Bonding and Planarization, 3D System Integration, 2009. 3DIC 2009. IEEE International Conference, Sep. 28-30, 2009, 5 pages.
OPTOIQ, Silicon Photonics: Ge-on-Si Emitter Moves Silicon Photonics Ahead, Jun. 1, 2009, 3 pages.
Sun et al., Electrically Pumped Hybrid Evanescent Si/InGaAsP Lasers, Optics Letters, vol. 34, No. 9, May 1, 2009, pp. 1345-1347.
Sun et al., Room-Temperature Direct Bandgap Electroluminescence from Ge-on-Si Light-Emitting Diodes, Optics Letters, vol. 34, No. 8, Apr. 15, 2009, pp. 1198-1200.
French Preliminary Search Report and Opinion for French Application No. 1157423 dated Mar. 21, 2012, 6 pages.

* cited by examiner

METHODS OF FORMING THREE-DIMENSIONALLY INTEGRATED SEMICONDUCTOR SYSTEMS INCLUDING PHOTOACTIVE DEVICES AND SEMICONDUCTOR-ON-INSULATOR SUBSTRATES

CROSS-REFERENCE TO RELATED APPLICATION

This application is a divisional of U.S. patent application Ser. No. 13/206,299, filed Aug. 9, 2011, now U.S. Pat. No. 8,842,945, issued Sep. 23, 2014, the disclosure of which is hereby incorporated herein in its entirety by this reference.

TECHNICAL FIELD

The present disclosure relates to bonded semiconductor structures using three-dimensional (3D) integration techniques, and to bonded semiconductor structures formed by such methods. More particularly, the present disclosure relates to three-dimensionally integrated semiconductor systems that include at least one photoactive device and at least a portion of a semiconductor-on-insulator (SeOI) substrate, and to methods of forming such three-dimensionally integrated semiconductor systems.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou et al., "The Handbook of 3D Integration," Wiley-VCH (2008). The 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

While three-dimensional integration techniques have been successfully applied to electronic integrated circuits, there remains a need in the art for three-dimensionally integrated photonic integrated circuit systems, and methods of forming such systems.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes three-dimensionally integrated semiconductor systems. The systems include a semiconductor-on-insulator (SeOI) substrate comprising a layer of semiconductor material, and a layer of electrically insulating material disposed adjacent a major surface of the layer of semiconductor material. The systems further include at least one photoactive device is formed on the layer of semiconductor material of the SeOI substrate, and at least one optical interconnect comprising a portion of the layer of semiconductor material of the SeOI substrate. The at least one optical interconnect is operatively coupled to the at least one photoactive device. The systems further include at least one current/voltage converter formed over the layer of semiconductor material of the SeOI substrate. At least one electrical pathway extends between the at least one photoactive device and the at least one current/voltage converter. At least one semiconductor device is bonded over the SeOI substrate, and at least one electrical pathway extends between the at least one current/voltage converter and the at least one semiconductor device bonded over the SeOI substrate.

In additional embodiments, the present disclosure includes methods of fabricating such three-dimensionally integrated semiconductor systems. For example, methods of fabricating three-dimensionally integrated semiconductor systems may include forming at least one photoactive device on a layer of semiconductor material of a semiconductor-on-insulator (SeOI) substrate. At least one waveguide may be formed that comprises a portion of the layer of semiconductor material of the SeOI substrate. The at least one waveguide may be operatively coupled with the at least one photoactive device. At least one current/voltage converter may be formed over the layer of semiconductor material of the SeOI substrate, and the at least one photoactive device and the at least one current/voltage converter may be operatively coupled with one another. At least one semiconductor device may be bonded over the SeOI substrate, and the at least one current/voltage converter and the at least one semiconductor device bonded over the SeOI substrate may be operatively coupled with one another.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

Figure 1:
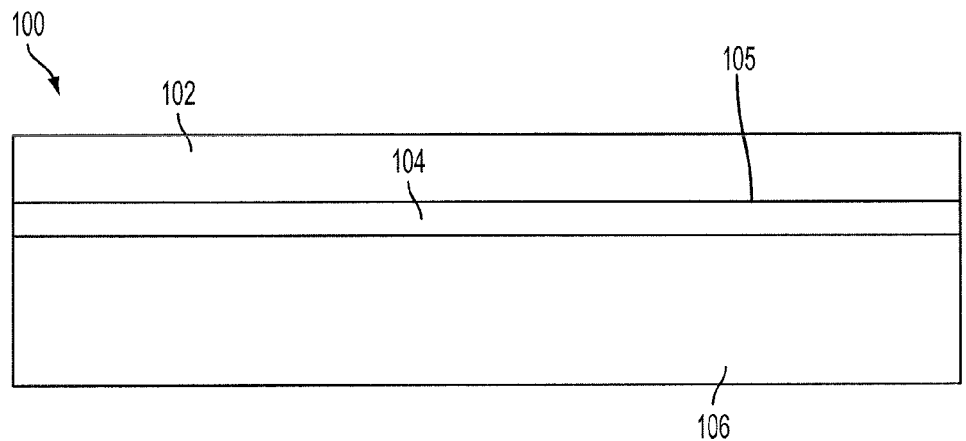
FIG. 1 is a simplified and schematically illustrated cross-sectional side view of a semiconductor-on-insulator (SeOI) substrate.

The illustrations presented herein are not meant to be actual views of any particular semiconductor structure, device, system, or method, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers that have been three-dimensionally integrated with one another. Semiconductor structures also include fully fabricated semiconductor structures (i.e., semiconductor devices), as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "semiconductor device" means and includes any fully processed and operational semiconductor structure, such as a semiconductor chip or package comprising an operational integrated circuit. Semiconductor devices include, for example, electronic signal processors (e.g., such as laser or other emitter device drivers and optoelectronic modulator drivers), electronic memory devices, as well as semiconductor devices comprising photoactive devices.

As used herein, the term "three-dimensionally integrated semiconductor system" means and includes any bonded semiconductor structure that comprises two or more semiconductor devices operatively coupled with one another.

As used herein, the term "electrical interconnect" means and includes any conductive feature or combination of features in a semiconductor structure that is used to electrically interconnect at least two device structures in the semiconductor structure by providing at least a portion of an electrical current pathway between the at least two device structures.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other term's, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis). Through wafer interconnects are a type of electrical interconnect.

As used herein, the term "optical interconnect" means and includes any feature in a semiconductor structure that is used to provide a pathway that is conductive to electromagnetic radiation at one or more wavelengths between at least two optical device structures in the semiconductor structure. Although the term "optical" is used, optical interconnects may be used to provide a pathway for one or more wavelengths of electromagnetic radiation, which wavelengths may be within or outside the visible region of the electromagnetic radiation spectrum (e.g., within one or both of the visible region and the infrared region of the electromagnetic radiation spectrum). Optical interconnects include waveguides, optical vias (OVs), and through wafer optical vias (TWOVs).

As used herein, the term "photoactive device" means and includes any device structure that is configured to emit electromagnetic radiation responsive to a current or voltage applied to the device structure and/or to generate a current or voltage responsive to impingement of electromagnetic radiation on the device structure. Thus, photoactive devices include photoemitters such as light-emitting diodes, lasers, etc., as well as photodetectors, solar cells, and other device structures configured to detect or receive electromagnetic radiation.

As used herein, the term "current/voltage converter" means and includes any device configured to convert a current input into a voltage signal output, or to convert a voltage input into a current signal output. For example, a current/voltage converter may comprise a plurality of device structures, such as transistors, capacitors, and resistors, operatively coupled with one another in an electrical integrated circuit configured to convert a current input into a voltage signal output, or to convert a voltage input into a current signal output. Current/voltage converters that are configured to convert a current input into a voltage signal output are often referred to in the art as "transimpedance amplifiers."

As used herein, the term "metallization layer" means and includes layer of a processed semiconductor structure that includes one or more of conductive lines, conductive vias, and conductive contact pads, which are used for conducting current along at least a portion of an electrical pathway.

In some embodiments, the present disclosure includes three-dimensionally integrated semiconductor systems that include at least one photoactive device operationally coupled with at least one current/voltage converter on a SeOI substrate.

FIG. 1 is a simplified cross-sectional side view of an SeOI substrate 100 that may be employed in embodiments of the present disclosure. As shown in FIG. 1, the SeOI substrate 100 includes a layer of semiconductor material 102, and a layer of electrically insulating material 104 (i.e., a dielectric material) disposed adjacent a major surface 103 of the layer of semiconductor material 102.

In some embodiments, the layer of semiconductor material 102 may be at least substantially single crystal semiconductor material. By way of example and not limitation, the layer of semiconductor material 102 may comprise single crystal silicon, germanium, or a III-V semiconductor material, and may be doped or undoped. In additional embodiments, the semiconductor material 102 may comprise polycrystalline or amorphous material. In some embodiments, the layer of semiconductor material 102 may comprise an epitaxial layer of semiconductor material. Further, the semiconductor material 102 may comprise a stack of multiple layers of semiconductor material in some embodiments. In embodiments in which the layer of semiconductor material 102 comprises silicon, the SeOI substrate 100 may comprise what is referred to in the art as a "silicon-on-insulator" (SOI) substrate.

The layer of semiconductor material 102 may be relatively thin. For example, in some embodiments, the layer of semiconductor material 102 may have a an average total thickness of about one micron (1 nm) or less, about five hundred nanometers (500 nm) or less, or even about ten nanometers (10 nm) or less.

The electrically insulating material 104 may comprise, for example, a ceramic material such as a nitride (silicon nitride (e.g., $Si_3N_4$)), or an oxide (e.g., silicon oxide ($SiO_2$) or a metal-oxide such as aluminum oxide ($Al_2O_3$). In some embodiments, the electrically insulating material 104 may comprise a stack of layers of such materials. In embodiments in which the electrically insulating material 104 comprises an oxide, the layer of electrically insulating material 104 may comprise what is referred to in the art as a "buried oxide layer" (BOL).

In some embodiments, the layer of electrically insulating material 104 may have a an average total thickness of about 500 hundred nanometers (500 nm) or less, about two hundred nanometers (200 nm) or less, or even about twenty nanometers (20 nm) or less.

Optionally, the layer of semiconductor material 102 and the layer of electrically insulating material 104 may be disposed over and carried by a base 106 of bulk substrate material. The layer of electrically insulating material 104 may be disposed between the layer of semiconductor material 102 and the base 106. By way of example and not limitation, the base 106 may comprise a semiconductor material, such as any of those mentioned above in relation to the semiconductor material 102, or an insulating material, such as any of those mentioned above in relation to the electrically insulating material 104. The base 106 also may comprise a multilayer structure including two more different materials in some embodiments.

As a non-limiting example, the SeOI substrate 100 shown in FIG. 1 may be formed using what is referred to in the art as the SMART CUT® process. Such processes are described in detail in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the disclosures of which are incorporated herein in their entireties by this reference.

Briefly, a relatively thick layer of semiconductor material may be bonded to the major surface 105 of the layer of electrically insulating material 104. The relatively thick layer of semiconductor material may have a composition identical to that of the layer of semiconductor material 102 to be provided over the layer of electrically insulating material 104, and the layer of semiconductor material 102 ultimately may be formed from, and comprise a relatively thinner portion of, the relatively thicker layer of semiconductor material bonded to the major surface 105 of the layer of electrically insulating material 104.

After bonding the relatively thick layer of semiconductor material to the layer of electrically insulating material 104, the relatively thick layer of semiconductor material may be thinned to form the relatively thin layer of semiconductor material 102 of FIG. 1. A portion of the relatively thick layer of semiconductor material may be removed from the relatively thin layer of semiconductor material 102, leaving the relatively thin layer of semiconductor material 102 behind on the surface 105 of the electrically insulating material 104.

To separate the relatively thin layer of semiconductor material 102 from the remainder of the relatively thicker layer of semiconductor material, a plurality of ions (e.g., one or more of hydrogen, helium, or inert gas ions) may be implanted into the relatively thicker layer of semiconductor material along an ion implant plane oriented parallel to the major surfaces of the layer of semiconductor material. In some embodiments, the plurality of ions may be implanted into the layer of semiconductor material before or after bonding the layer of semiconductor material to the layer of electrically insulating material 104 and the base 106.

Ions may be implanted along a direction substantially perpendicular to the layer of semiconductor material. As known in the art, the depth at which the ions are implanted into the layer of semiconductor material is at least partially a function of the energy with which the ions are implanted into the layer of semiconductor material. Generally, ions implanted with less energy will be implanted at relatively shallower depths, while ions implanted with higher energy will be implanted at relatively deeper depths.

Ions may be implanted into the layer of semiconductor material with a predetermined energy selected to implant the ions at a desired depth within the layer of semiconductor material, which depth will determine the thickness of the layer of semiconductor material 102. As known in the art, at least some ions may be implanted at depths other than the desired implantation depth, and a graph of the concentration of the ions as a function of depth into the layer of semiconductor material from the surface of the layer of semiconductor material may exhibit a generally bell shaped (symmetric or asymmetric) curve having a maximum at the desired implantation depth.

After implanting ions into the layer of semiconductor material, the ions may define an ion implant plane within the layer of semiconductor material. The ion implant plane may comprise a layer or region within the layer of semiconductor material that is aligned with (e.g., centered about) the plane of maximum ion concentration within the layer of semiconductor material. The ion implant plane may define a zone of weakness within the layer of semiconductor material along which the layer of semiconductor material may be cleaved or fractured in a subsequent process. For example, the layer of semiconductor material may be heated to cause the layer of semiconductor material to cleave or fracture along the ion implant plane. Optionally, mechanical forces may be applied to the layer of semiconductor material to cause or assist in the cleaving of the layer of semiconductor material along the ion implant plane.

In additional embodiments, the relatively thin layer of semiconductor material 102 may be provided over the layer of electrically insulating material 104 and the base 106 by bonding the relatively thick layer of semiconductor material (e.g., a layer having an average thickness of greater than about 100 microns) to the layer of electrically insulating material 104 and the base 106, and subsequently thinning the relatively thick layer of semiconductor material from the side thereof opposite the base 106 using a chemical process (e.g., a wet or dry chemical etching process), a mechanical process (e.g., a grinding or lapping process), or by a chemical-mechanical polishing (CMP) process.

In yet further embodiments, the relatively thin layer of semiconductor material 102 may be formed in situ over (e.g., on) the surface 105 of the layer of electrically insulating material 104. For example, the SeOI substrate 100 of FIG. 1 may be formed by depositing semiconductor material, such as silicon, polysilicon, or amorphous silicon, on the surface 105 of the layer of electrically insulating material 104 to a desirable thickness. For example, a plasma enhanced chemical vapor deposition process may be used to form the relatively thin layer of semiconductor material 102.

In some embodiments, the relatively thin layer of semiconductor material 102 may be thickened after transferring the relatively thin layer of semiconductor material 102 onto the layer of electrically insulating material 104. For example, additional semiconductor material (e.g., Si, SiGe, Ge, III-V semiconductor material, etc.) may be grown or otherwise deposited on the exposed major surface of the relatively thin layer of semiconductor material 102. The final thickness of the layer of semiconductor material 102 may depend upon the lattice mismatch between the layer of semiconductor material 102 and the layer of electrically insulating material 104, and the thickness requirements of devices to be fabricated on or in the layer of semiconductor material 102.

A three-dimensionally integrated system may be fabricated using the SeOI substrate 100, as discussed in further detail below.

Figure 2:
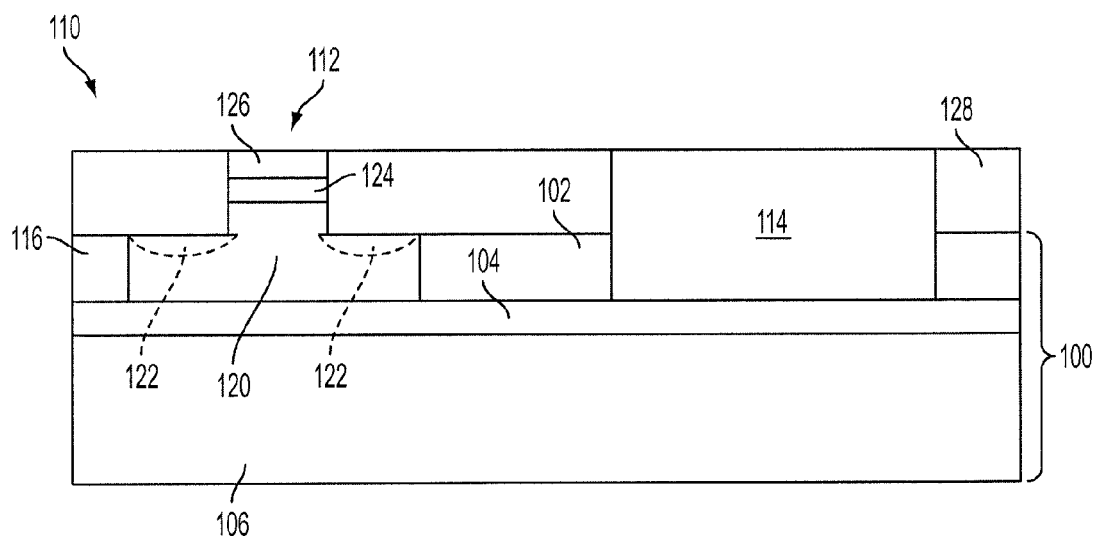
FIG. 2 is a simplified and schematically illustrated cross-sectional side view illustrating a photoactive device and a current/voltage converter fabricated on the SeOI substrate of FIG. 1.

FIG. 2 is a simplified and schematically illustrated cross-sectional side view illustrating a processed semiconductor structure 110 that includes at least one photoactive device 112 and at least one current/voltage converter 114 that have been fabricated on the SeOI substrate 100 of FIG. 1. The photoactive device 112 may be formed on the layer of semiconductor material 102 of the SeOI substrate 100. The current/voltage converter 114 also may be formed on a different area or region of the layer of semiconductor material 102 of the SeOI substrate 100.

In some embodiments, the photoactive device 112 may comprise a photodetector configured to generate electrical current responsive to impingement of electromagnetic radiation on the photodetector. The electrical current generated by such a photodetector may be conveyed to the current/voltage converter 114. In additional embodiments, the photoactive device 112 may comprise a photoemitter configured to generate an electromagnetic radiation signal responsive to an electrical signal input, which may be provided by the current/voltage converter 114. For example, such a photoemitter may comprise a light emitting diode (LED), or a laser device configured to emit at least substantially coherent electromagnetic radiation.

As a non-limiting example, the photoactive device 112 may comprise a photodiode that includes at least one PN junction configured to operate as a photodetector. As shown in FIG. 2, the photodetector may include a first region 120 comprising silicon that is relatively lightly P doped (P+) (e.g., doped with one or more of boron and gallium). The silicon may comprise a portion of the layer of semiconductor material 102 of the SeOI substrate 100. One or more electrical contact regions 122 may be formed on the first region 120 that comprise silicon that is relatively heavily P doped (P++). The photodetector may include a second region 124 comprising a volume of intrinsic germanium disposed over and in direct physical contact with the first region 120, as shown in FIG. 2. A third region 126 comprising relatively heavily N doped (N++) (e.g., doped with one or more of nitrogen, phosphorous, arsenic, antimony, and bismuth) may be disposed over and in direct physical contact with the second region 124.

The photodetector shown in FIG. 2 may be fabricated using conventional lithographic techniques known in the art of semiconductor device fabrication. For example, an exposed major surface of the layer of semiconductor material 102 may be masked, and the mask may be patterned to form apertures therein corresponding to the locations at which it is desired to form the first region 120. The exposed portion of the layer of semiconductor material 102 then may be lightly doped with a P type dopant through the mask. The mask may be removed, and a second mask may be deposited and patterned such that the second mask includes apertures therethrough at which it is desired to form the electrical contact regions 122. The exposed portions of the first region 120 then may be further doped with additional P type dopant through the second mask to form the electrical contact regions 122. The second mask then may be removed, and a dielectric layer 128 may be deposited over the layer of semiconductor material 102, the first region 120 of the photodetector, and the electrical contact regions 122. The dielectric layer 128 may comprise, for example, an oxide layer and/or a nitride layer. After depositing the dielectric layer 128, an exposed major surface of the dielectric layer 128 may be masked, and the mask may be patterned to form apertures therein corresponding to the locations at which it is desired to form the second region 124 and the third region 126 of the photodetector. The dielectric layer 128 may be etched through the patterned mask layer to form recesses in the dielectric layer 128. Optionally, in situ lightly P doped silicon may be grown over the first region 120 to extend the first region 120 into the recesses formed in the dielectric layer 128 by the etching process. Intrinsic germanium then may be deposited within the remaining portion of the recesses in the dielectric layer 128, which defines the second region 124. To form the third region 126, a portion of the intrinsic germanium then may be doped with an N type dopant.

In the above-described configuration, the photoactive device 112 may comprise a photodetector that will generate current flow between the electrical contact regions 122 and the third region 126 of the photoactive device 112 when a particular wavelength or wavelengths of electromagnetic radiation impinges on the various regions of the photoactive device 112, which wavelength(s) will be a function of the particular compositions of the various regions, as known in the art.

The above-described configuration and manufacturing process for the photoactive device 112 is provided as one non-limiting example. Various other types of photoactive devices and manufacturing processes for forming such photoactive devices are known in the art and may be employed in embodiments of the disclosure. As another example, in additional embodiments, the photoactive device 112 may comprise a germanium-on-silicon emitter device, as described below with reference to FIG. 7.

The current/voltage converter 114 may be fabricated on a different region of the layer of semiconductor material 102 before fabricating the photoactive device 112, after forming the photoactive device 112, or at least partially in conjunction with the fabrication of the photoactive device 112. Many different types and configurations of current/voltage converters 114 are known in the art and may be employed in embodiments of the present disclosure. Such current/voltage converters 114 typically include a plurality of transistors, capacitors, and resistors operatively coupled with one another to provide a circuit (e.g., an integrated circuit) that is configured to convert a current input into a voltage signal output, or to convert a voltage input into a current signal output. In some embodiments, such as those in which the photoactive device 112 comprises a photodetector configured to generate a current responsive to impingement of electromagnetic radiation on the photoactive device 112, the current/voltage converter 114 may comprise a transimpedance amplifier that is configured to convert a current input provided by the photoactive device 112 into a voltage signal output.

Processes for the fabrication of the various components of the current/voltage converter 114, including transistors, capacitors, and resistors, are known in the art of semiconductor fabrication. Further, one or more of the various components of the current/voltage converter 114, such as the channel regions of field effect transistors, may comprise portions of the layer of semiconductor material 102.

In additional embodiments, the current/voltage converter 114 may be formed in another substrate layer, which may be stacked and bonded over the layer of semiconductor material 102. The electrical interconnections between the conductive features formed on or in the layer of semiconductor material 102 and such a current/voltage converter 114 may be defined by vertically extending conductive vias and laterally extending conductive traces (e.g., conductive lines of a redistribution layer (RDL)).

The processed semiconductor structure 100 may also include at least one optical interconnect, such as a waveguide 116, that comprises a portion of the layer of semiconductor material 102 of the SeOI substrate 100. The waveguide 116 may be operatively coupled to the photoactive device 112, and configured to convey electromagnetic radiation to the photoactive device 112 in embodiments in which the photoactive device 112 comprises a photodetector, or to convey electromagnetic radiation emitted by the photoactive device 112 away from the photoactive device 112 in embodiments in which the photoactive device 112 comprises a photoemitter.

Figure 3:
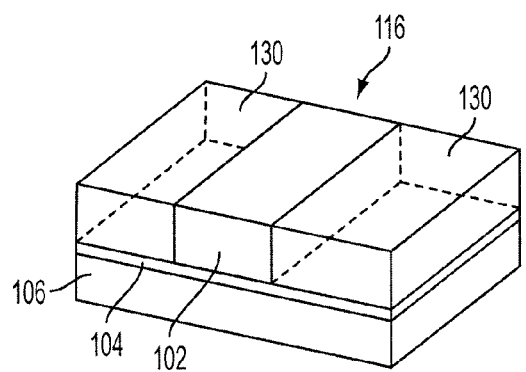
FIG. 3 is a simplified and schematically illustrated perspective view of a waveguide comprising a portion of a semiconductor material of the SeOI substrate of FIG. 2.

The waveguide 116 may comprise an isolated portion of the layer of semiconductor material 102. FIG. 3 is a simplified perspective view of a portion of the structure 110 of FIG. 2 that includes a section of the waveguide 116. The waveguide 116 may be formed by removing portions of the layer of semiconductor material 102 laterally adjacent the portion of the layer of semiconductor material 102 that is to define and comprise the waveguide 116, and replacing the removed portions of the layer of semiconductor material 102 with another material that has a different refractive index than does the layer of semiconductor material 102. For example, a masking and etching process could be used to remove the portions of the layer of semiconductor material 102 and form recesses laterally adjacent the waveguide 116. An oxide 130 or other dielectric material then may be deposited in the recesses to laterally isolate the portion of the layer of semiconductor material 102 that defines and comprises the waveguide 116.

As known in the art, the cross-sectional dimensions of the waveguide 116 (e.g., the width and height of the waveguide 116), together with the composition of the waveguide 116 and the surrounding materials, will at least partially determine the wavelengths or wavelengths of radiation that may be guided and conveyed through the waveguide 116 without significant loss. Thus, the particular dimensions of the waveguide 116 will be selected in consideration of the wavelength or wavelengths of radiation to be conveyed by the waveguide 116 and the materials surrounding the waveguide 116, such as the oxide 130, the layer of electrically insulating material 104, and the dielectric layer 128 (FIG. 4).

Although the waveguide 116 is illustrated in FIG. 2 as extending to the lateral side of the photoactive device 112 from the perspective of FIG. 2, in additional embodiments, the waveguide 116 may extend into or out from the plane of FIG. 2, and may extend to and contact a central region of the photoactive device 112 between the electrical contact regions 122. Such a configuration may improve the efficiency by which electromagnetic radiation conveyed by the waveguide 116 impinges on the photoactive material or materials of the photoactive device 112.

Referring again to FIG. 2, in embodiments in which the photoactive device 112 comprises a photodetector, electromagnetic radiation may simply enter the waveguide 116 from the exterior of the structure 110. For example, electromagnetic radiation may impinge on the photoactive device 112, and/or the waveguide 116 which is configured to convey the electromagnetic radiation to the photoactive device 112. The photoactive device 112 may generate an electrical current responsive to the impingement of the electromagnetic radiation thereon. In other embodiments, electromagnetic radiation may enter the waveguide 116 from another device optically coupled with the waveguide 116, and conveyed to the photoactive device 112 by the waveguide 116.

Figure 4:
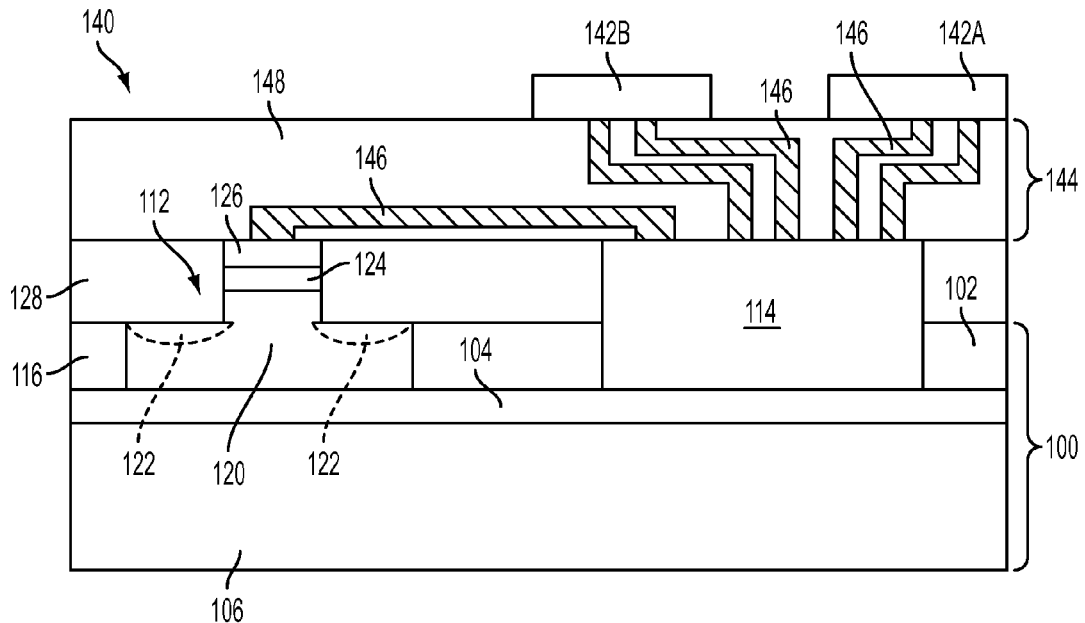
FIG. 4 is a simplified and schematically illustrated cross-sectional side view illustrating a three-dimensionally integrated semiconductor system comprising a plurality of semiconductor devices bonded over and operatively coupled with the structure of FIG. 2.

Referring to FIG. 4, a three-dimensionally integrated semiconductor system 140 may be formed from the semiconductor structure 110 of FIG. 2 by electrically and operatively coupling together the at least one photoactive device 112 and the at least one current/voltage converter 114, bonding one or more semiconductor devices 142A, 142B over the SeOI substrate 100, and electrically and operatively coupling together the at least one current/voltage converter 114 and the one or more semiconductor devices 142A, 142B bonded over the SeOI substrate 100.

For example, one or more metallization layers 144 may be formed over the dielectric layer 128, the photoactive device 112, and the current/voltage converter 114. The metallization layers 144 include a plurality of electrically conductive features 146. The plurality of electrically conductive features 146 may comprise one or more of vertically extending conductive vias, laterally extending conductive traces, and conductive contact pads. At least some of the conductive features 146 may be in electrical contact with corresponding features of the photoactive device 112, such as the electrical contact regions 122 and the third region 126. At least some of the conductive features 146 may be in electrical contact with corresponding features of the current/voltage converter 114, such as resistors, capacitors, and source regions, drain regions, and gate structures of transistors. The conductive features 146 may be formed from and comprise a metal. The one or more metallization layers 144 may be formed in a layer-by-layer process, in which alternating layers of metal and dielectric material are deposited and patterned in such a manner as to form the conductive features 146, which may be embedded within and surrounded by a dielectric material 148. The conductive features 146 may be used to form and provide at least one electrical pathway extending between the at least one photoactive device 112 and the at least one current/voltage converter 114, and to form and provide at least one electrical pathway extending between the at least one current/voltage converter 114 and the semiconductor devices 142A, 142B that are to be bonded over the SeOI substrate 100, and the photoactive device 112 and current/voltage converter 114 formed thereon. In some embodiments, the conductive features 146 may be used to provide one or more electrical pathways extending between two or more of the semiconductor devices 142A, 142B, such that the semiconductor devices 142A, 142B may be electrically and operatively coupled with one another. In such embodiments, one or more of the semiconductor devices 142A, 142B may not be directly electrically and operatively coupled with the current/voltage converter 114. In some embodiments, the one or more metallization layers 144 may comprise what is referred to in the art as a redistribution layer (RDL).

Each of the one or more semiconductor devices 142A, 142B may comprise one or more of an electronic signal processor device, an electronic memory device, an additional photoactive device, etc. In some embodiments, one or more of the semiconductor devices 142A, 142B bonded over the SeOI substrate 100 may comprise an electronic signal processor. For example, a first semiconductor device 142A may comprise an electronic signal processor. In such embodiments, a second semiconductor device 142B also may comprise an electronic signal processor, or the second semiconductor device 142B may comprise a different type of semiconductor device, such as an electronic memory device or an additional photoactive device.

Each of the plurality of semiconductor devices 142A, 142B may be bonded over the SeOI substrate 100 by, for example, structurally and electrically coupling conductive features, such as bond pads, on the semiconductor devices 142A, 142B to respective conductive features 146, such as bond pads, of the one or more metallization layers 144. The conductive features of the semiconductor devices 142A, 142B may be bonded to the conductive features 146 of the one or more metallization layers 144 using, for example, conductive bumps or balls, as known in the art. In additional embodiments, the conductive features of the semiconductor devices 142A, 142B may be bonded to the conductive features 146 of the one or more metallization layers 144 using a direct bonding process.

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure. "Thermal-compression bonding" methods are direct bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.). Additional direct bonding methods may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

After providing the two surfaces in direct physical contact, a bonding wave may be initiated at and propagated along the interface between two abutting surfaces. A direct chemical bond is established between the two abutting surfaces at the wave front as the wave front spreads across the bonding interface between the two abutting surfaces. Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve suitable bond strength at the bonding interface. Ultra-low temperature direct bonding methods in which pressure is applied between the bonding surfaces are often referred to in the art as "surface assisted bonding" or "SAB" methods. Thus, as used herein, the terms "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

With continued reference to FIG. 4, the conductive features of the semiconductor devices 142A, 142B may be bonded to the conductive features 146 of the one or more metallization layers 144 using a metal-to-metal direct bonding process, such as a thermo-compression bonding process or an ultra-low temperature direct bonding process, which may or may not comprise a surface-assisted bonding (SAB) process.

In the three-dimensionally integrated semiconductor system 140 of FIG. 4, the at least one photoactive device 112 and the one or more semiconductor devices 142A, 142B bonded over the SeOI substrate 100 are disposed on a common side of the layer of electrically insulating material 104 of the SeOI substrate 100. Additionally, the at least one current/voltage converter 114 is disposed on the same common side of the layer of electrically insulating material 104 of the SeOI substrate 100, which is the side on which the layer of semiconductor material 102 is disposed and the side opposite the base 106. In additional embodiments, however, the at least one photoactive device 112 and the one or more semiconductor devices 142A, 142B bonded over the SeOI substrate 100 may be disposed on opposing sides of the layer of electrically insulating material 104 of the SeOI substrate 100.

Figure 5:
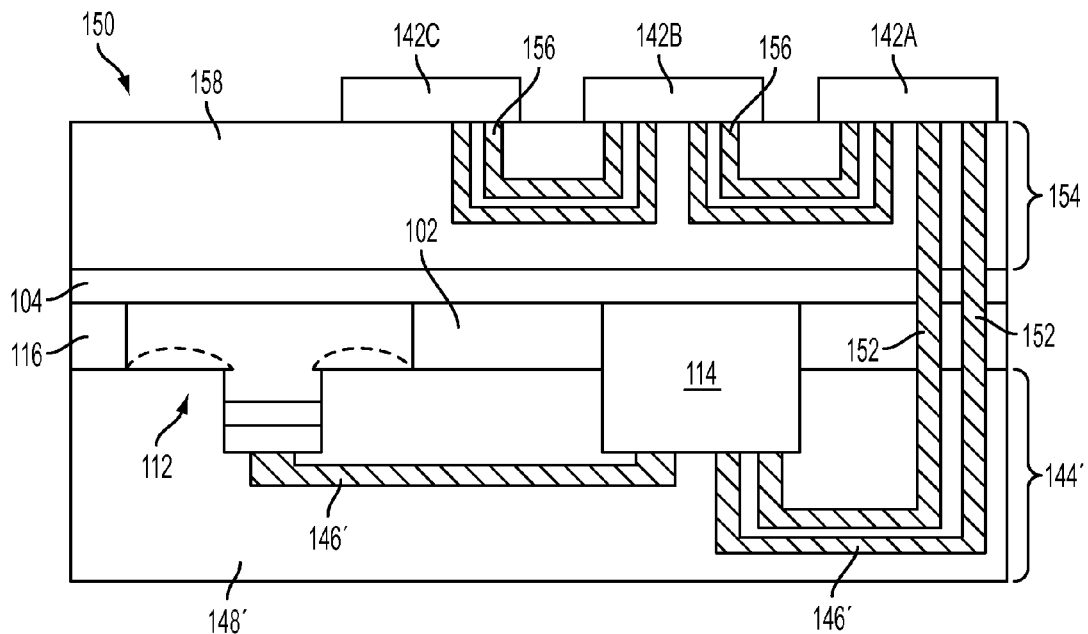
FIG. 5 is a simplified and schematically illustrated cross-sectional side view illustrating another three-dimensionally integrated semiconductor system similar to that of FIG. 4, but wherein a portion of a SeOI substrate, a photoactive device, and a current/voltage converter are inverted relative to the structure of FIG. 4.

For example, FIG. 5 illustrates an additional embodiment of a three-dimensionally integrated semiconductor system 150 that is generally similar to the three-dimensionally integrated semiconductor system 140 of FIG. 4 and includes a photoactive device 112, a current/voltage converter 114, and a waveguide 116. The three-dimensionally integrated semiconductor system 150 is also faulted using the SeOI substrate 100 of FIG. 1 and includes the layer of semiconductor material 102 and the layer of electrically insulating material 104. In the embodiment of FIG. 5, however, the base 106 of the SeOI substrate 100 has been removed during fabrication. The layer of semiconductor material 102, the layer of electrically insulating material 104, the photoactive device 112, and the current/voltage converter 114 are inverted relative to the three-dimensionally integrated semiconductor system of FIG. 4 from the perspectives of FIGS. 4 and 5.

As shown in FIG. 5, the at least one photoactive device 112 and the one or more semiconductor devices 142A, 142B bonded over the SeOI substrate 100 may be disposed on opposing sides of the layer of electrically insulating material 104 of the SeOI substrate 100, and the at least one photoactive device 112 and the at least one current/voltage converter 114 are disposed on a common side of the layer of electrically insulating material of the SeOI substrate 100 (FIG. 1).

As shown in FIG. 5, the three-dimensionally integrated semiconductor system 150 includes one or more metallization layers 144' that are analogous to the previously described metallization layers 144, and include conductive features 146' embedded within and surrounded by dielectric material 148'. The one or more metallization layers 144' are disposed over the layer of semiconductor material 102, the photoactive device 112, and the current/voltage converter 114 on a common side of the layer of electrically insulating material 104. In the embodiment of FIG. 5, however, through wafer interconnects 152 are used to transfer the electrical pathways through the three-dimensionally integrated semiconductor system 150 from the side thereof over the layer of semiconductor material 102 (i.e., from an active side or surface of the three-dimensionally integrated semiconductor system 150) to the side thereof over the layer of electrically insulating material 104 (i.e., to a back side of the three-dimensionally integrated semiconductor system 150).

One or more additional metallization layers 154 may be foamed over the layer of electrically insulating material 104 on an opposing side of the three-dimensionally integrated semiconductor system 150 from the one or more metallization layers 144'. The one or more additional metallization layers 154 may be generally similar to the previously described metallization layers 144, 144', and may include a plurality of conductive features 156, such as laterally extending conductive traces, vertically extending conductive vias, and conductive pads, which may be embedded within and surrounded by a dielectric material 158. In some embodiments, the one or more metallization layers 154 may comprise a redistribution layer (RDL).

A plurality of semiconductor devices 142A, 142B, 142C may be bonded to the conductive features 156 and/or the dielectric material 158 of the one or more metallization layers 154 over the remaining portion of the SeOI substrate 100 (FIG. 1) (i.e., over the layer of electrically insulating material 104 and the layer of semiconductor material 102). Each of the plurality of semiconductor devices 142A, 142B, 142C may comprise one or more of the different types of semiconductor devices previously mentioned with reference to FIG. 4.

The conductive features 146' of the one or more metallization layers 144' may be used to form or otherwise provide at least one electrical pathway extending between the at least one photoactive device 112 and the at least one current/voltage converter 114. Additionally, the conductive features 146' of the one or more metallization layers 144', the through wafer interconnects 152, and/or the conductive features 156 of the one or more metallization layers 154 may be used to form or otherwise provide at least one electrical pathway extending between the at least one current/voltage converter 114 and one or more of the plurality of semiconductor devices 142A, 142B, 142C bonded over the layer of electrically insulating material 104 and the layer of semiconductor material 102 of the SeOI substrate 100 (FIG. 1).

To form the three-dimensionally integrated semiconductor system 150 of FIG. 5, the one or more metallization layers 144' may be formed over the photoactive device 112, the current/voltage converter 114, and the dielectric layer 128 of the processed semiconductor structure 110 of FIG. 2. A carrier substrate (e.g., a carrier wafer) then may be temporarily bonded over the one or more metallization layers 144', and the base 106 then may be at least partially removed from the structure 110. The one or more metallization layers 154 then may be formed over the layer of electrically insulating material 104, and the through wafer interconnects 152 may be formed through the one or more metallization layers 154, the layer of electrically insulating material 104, the layer of semiconductor material 102, and the one or more metallization layers 144'. The plurality of semiconductor devices 142A, 142B, 142C then may be bonded to the conductive features 156 and/or the dielectric material 158 of the one or more metallization layers 154.

In additional embodiments, the present invention includes three-dimensionally integrated semiconductor systems that include two or more photoactive devices that are operatively coupled with one another. For example, such three-dimensionally integrated semiconductor systems may include at least one photoemitter configured to emit electromagnetic radiation, at least one photodetector configured to receive the electromagnetic radiation emitted by the photoemitter, and at least one optical interconnect optically coupling the photoemitter and the photodetector and configured to convey the electromagnetic radiation emitted by the photoemitter to the photodetector.

Figure 6:
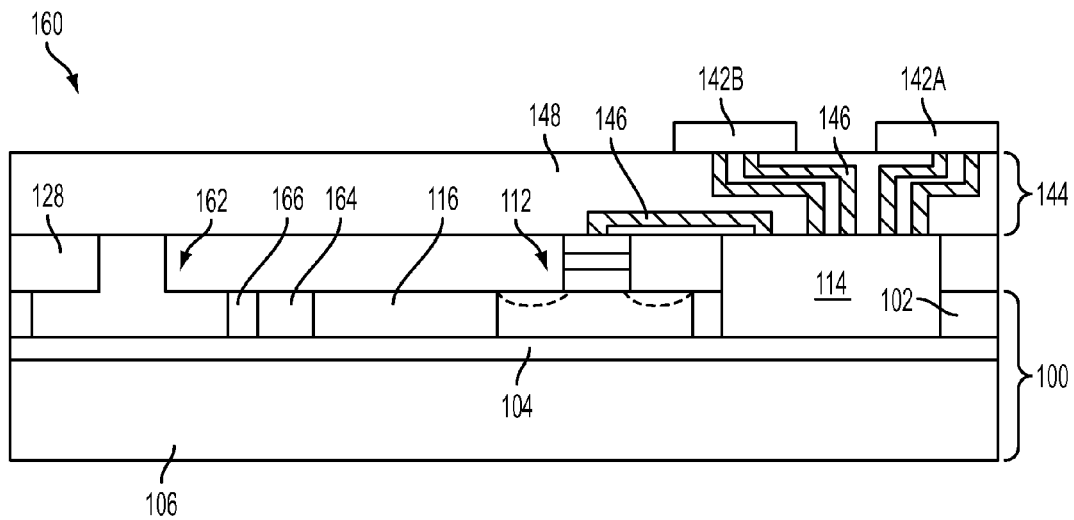
FIG. 6 is a simplified and schematically illustrated cross-sectional side view illustrating another three-dimensionally integrated semiconductor system similar to that of FIG. 4, but further comprising an additional photoactive device fabricated on the SeOI substrate and operatively coupled with the first photoactive device.

FIG. 6 illustrates an example of such an embodiment of a three-dimensionally integrated semiconductor system 160. The three-dimensionally integrated semiconductor system 160 of FIG. 6 is generally similar to the three-dimensionally integrated semiconductor system 140 of FIG. 4, and includes a photoactive device 112, a current/voltage converter 114, and a waveguide 116 formed over and carried by the SeOI substrate 100. The three-dimensionally integrated semiconductor system 160 also includes one or more metallization layers 144 and a plurality of semiconductor devices 142A, 142B bonded over the one or more metallization layers 144 and the SeOI substrate 100. The three-dimensionally integrated semiconductor system 160 further includes an additional photoactive device 162 that is operatively coupled with the first photoactive device 112. For example, the additional photoactive device 162 may comprise a photoemitter that is configured to emit electromagnetic radiation. Optionally, the three-dimensionally integrated semiconductor system 160 may comprise a modulator 164, which is schematically illustrated in FIG. 6, and may be used to selectively modulate the electromagnetic radiation emitted by the additional photoactive device 162. A waveguide 166 may extend from the additional photoactive device 162 to the modulator 164, and the waveguide 166 may extend from the modulator 164 to the first photoactive device 112, which may comprise a photodetector configured to receive the modulated electromagnetic radiation. The waveguide 166 may comprise a waveguide as previously described with reference to the waveguide 116 of FIG. 3. Many different configurations of photonic modulators that may be fabricated on an SeOI type substrate are known in the art and may be employed in embodiments of the disclosure.

Figure 7:
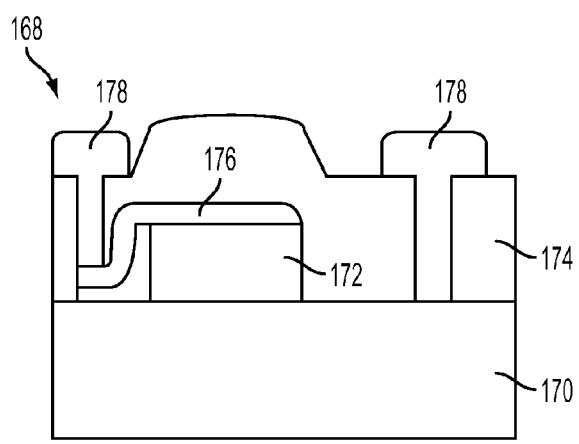
FIG. 7 is a simplified and schematically illustrated cross-sectional side view of a germanium-on-silicon emitter device, which may be employed as the additional photoactive device shown in FIG. 6.

The additional photoactive device 162 may comprise, for example, a light emitting diode (LED) or a laser device. By way of non-limiting example, the additional photoactive device 162 may comprise a germanium-on-silicon emitter device 168, as illustrated in FIG. 7. Such germanium-on-silicon emitter devices 168 are described in further detail in, for example, X. Sun et al., Optics Lett. 34(8) p. 1198 (Apr. 15, 2009) and X. Sun et al., Optics Lett. 34(9) p. 1345 (May 1, 2009), each of which is hereby incorporated herein in its entirety by this reference.

Referring to FIG. 7, the germanium-on-silicon emitter device 168 may comprise a volume of P doped silicon 170, and a volume of N doped germanium 172 disposed on the P doped silicon 170. The P doped silicon 170 may comprise a portion of the layer of semiconductor material 102 (FIG. 1) that has been doped with one or more P type dopants (e.g., doped with one or more of boron and gallium). The volume of germanium 172 may be doped with one or more N type dopants (e.g., doped with one or more of nitrogen, phosphorous, arsenic, antimony, and bismuth), and may be doped in situ during growth of the volume of germanium 172.

The volume of N doped germanium 172 may be in a state of tensile strain. For example, the volume of germanium 172 may be in a state of from about 0.20% to about 0.25% tensile strain. The tensile strain may be provided within the volume of germanium 172 by epitaxially growing the volume of germanium 172 in a relaxed state over the P doped silicon 170 in a chemical vapor deposition (CVD) process at an elevated temperature, and subsequently cooling the volume of germanium 172. The volume of germanium 172 may be grown at an elevated temperature between about 600° C. and about 700° C. (e.g., about 650° C.), and may be fully relaxed during the growth process. The tensile strain may be induced within the volume of germanium 172 upon cooling the volume of germanium 172 to room temperature after deposition. Optionally, post growth thermal annealing processes may be used to tailor the magnitude of the tensile strain within the volume of germanium 172, which will affect the bandgap of the volume of germanium 172.

A dielectric material 174 may be disposed over the volume of germanium 172 and the volume of P doped silicon 170. The dielectric material 174 may comprise a dielectric material 128 as previously described herein. An N doped polysilicon contact 176 may be disposed on and in direct physical contact with the volume of N doped germanium 172. Electrical contacts 178, which may comprise conductive features 146 of the one or more metallization layers 144 (FIG. 6), may extend through the dielectric material 174 to the N doped polysilicon contact 176 and the volume of P doped silicon 170, respectively, as shown in FIG. 7.

In this configuration, by applying a voltage between the electrical contacts 178, and, hence, across the PN junction between the volume of P doped silicon 170 and the volume of N doped germanium 172, the germanium-on-silicon emitter device 168 may be caused to emit electromagnetic radiation. The emitted electromagnetic radiation may have a wavelength of, for example, between about 1,560 nanometers and about 1,620 nanometers.

In additional embodiments, three-dimensionally integrated semiconductor systems may include additional photoactive devices that are bonded over the SeOI substrate 100 and operatively coupled with a first photoactive device 112 formed on the layer of semiconductor material 102 of the SeOI substrate 100.

Figure 8:
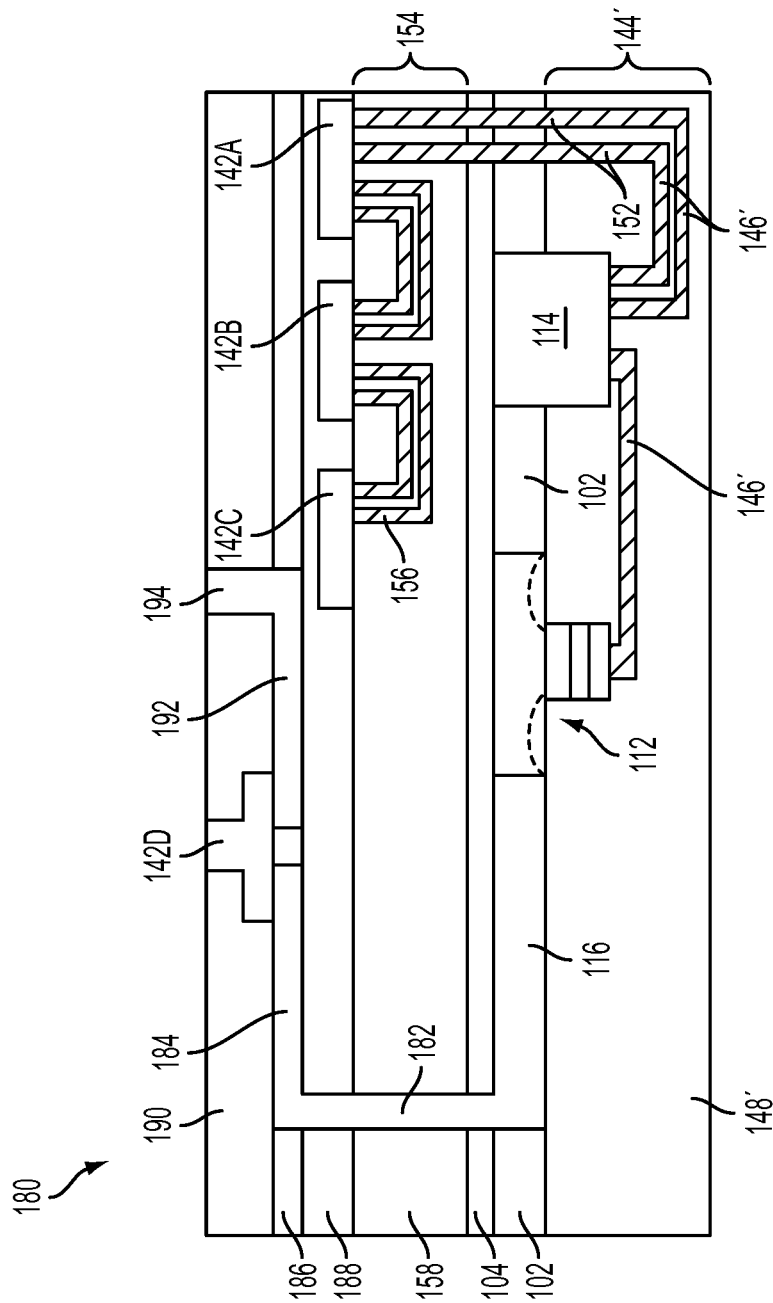
FIG. 8 is a simplified and schematically illustrated cross-sectional side view illustrating another three-dimensionally integrated semiconductor system similar to that of FIG. 5, but further comprising an additional photoactive device bonded vertically over the structure of FIG. 5 and operatively coupled with the first photoactive device.

For example, FIG. 8 illustrates a three-dimensionally integrated semiconductor system 180 that is generally similar to the three-dimensionally integrated semiconductor system 150 of FIG. 5 and includes a photoactive device 112, a current/voltage converter 114, and a waveguide 116 disposed over the layer of semiconductor material 102 and the layer of electrically insulating material 104. The three-dimensionally integrated semiconductor system 180 also includes one or more metallization layers 144' including conductive features 146' embedded within and surrounded by dielectric material 148'. Through wafer interconnects 152 are used to transfer the electrical pathways through the three-dimensionally integrated semiconductor system 180 from the side thereof over the layer of semiconductor material 102 (i.e., from an active side or surface of the three-dimensionally integrated semiconductor system 180) to the side thereof over the layer of electrically insulating material 104 (i.e., to a back side of the three-dimensionally integrated semiconductor system 180). One or more additional metallization layers 154 may be formed over the layer of electrically insulating material 104, and may include a plurality of conductive features 156 embedded within and surrounded by a dielectric material 158, as previously described with reference to FIG. 5. A plurality of semiconductor devices 142A, 142B, 142C may be bonded to the conductive features 156 and/or the dielectric material 158 of the one or more metallization layers 154 over the remaining portion of the SeOI substrate 100 (FIG. 1).

In the embodiment of FIG. 8, an additional semiconductor device 142D is bonded over the remaining portion of the SeOI substrate 100 (FIG. 1) (i.e., bonded over the layer of electrically insulating material 104 and the layer of semiconductor material 102). The additional semiconductor device 142D comprises a photoactive device. For example, the additional semiconductor device 142D may comprise a light emitting diode (LED) or a laser device. By way of non-limiting example, the additional photoactive device 162 may comprise a germanium-on-silicon emitter device 168, as previously described with reference to FIG. 7.

The photoactive device 142D may be operatively (i.e., optically) coupled with the first photoactive device 112 that is formed on the layer of semiconductor material 102 of the SeOI substrate 100 (FIG. 1). For example, the additional semiconductor device 142D may comprise a photoemitter that is configured to emit electromagnetic radiation. Optionally, the three-dimensionally integrated semiconductor system 180 may comprise a modulator (not shown) like the modulator 164 previously described with reference to FIG. 6, which may be used to selectively modulate the electromagnetic radiation emitted by the additional semiconductor device 142D. The first photoactive device 112 may comprise a photodetector configured to receive the electromagnetic radiation emitted by the additional semiconductor device 142D comprising the photoemitter.

The three-dimensionally integrated semiconductor system 180 further comprises a plurality of optical interconnects configured to convey electromagnetic radiation between the photoactive device of the additional semiconductor device 142D and the at least one photoactive device 112 formed on the layer of semiconductor material 102 of the SeOI substrate 100 (FIG. 1). The plurality of optical interconnects may include, for example, the waveguide 116 that comprises a portion of the layer of semiconductor material 102 of the SeOI substrate 100, as previously described with reference to FIGS. 2 and 3. The plurality of optical interconnects may include at least one through wafer optical interconnect 182 that extends vertically through the three-dimensionally integrated semiconductor system 180 (from the perspective of FIG. 8) in a direction perpendicular to the layer of semiconductor material 102 and the layer of electrically insulating material 104. One end of the through wafer optical interconnect 182 may extend to and be operatively coupled with the waveguide 116, and an opposing end of the through wafer optical interconnect 182 may extend to and be operatively coupled to another waveguide 184 that extends from the through wafer optical interconnect 182 to the photoactive device of the additional semiconductor device 142D, as shown in FIG. 8.

The additional waveguide 184 may comprise a portion of an additional layer of semiconductor material 186. The additional layer of semiconductor material 186 may comprise any of the materials previously described in relation to the layer of semiconductor material 102. The additional layer of semiconductor material 186 may be separately formed and transferred onto a dielectric material 188 deposited over the processed semiconductor devices 142A, 142B, 142C, as shown in FIG. 8. In additional embodiments, the additional layer of semiconductor material 186 may be formed (e.g., deposited) in situ on the dielectric material 188.

Optionally, the additional semiconductor device 142D may be at least partially surrounded by an additional dielectric material 190. Also, an additional waveguide 192 comprising a portion of the additional layer of semiconductor material 186 may extend from the additional semiconductor device 142D to yet another through wafer optical interconnect 194. The through wafer interconnect 194 could be used to three-dimensionally integrate yet further additional semiconductor devices vertically over the three-dimensionally integrated semiconductor system 180, and to operatively (e.g., optically) couple photoactive devices of such additional semiconductor devices with the photoactive devices of the three-dimensionally integrated semiconductor system of FIG. 8.

Figure 9:
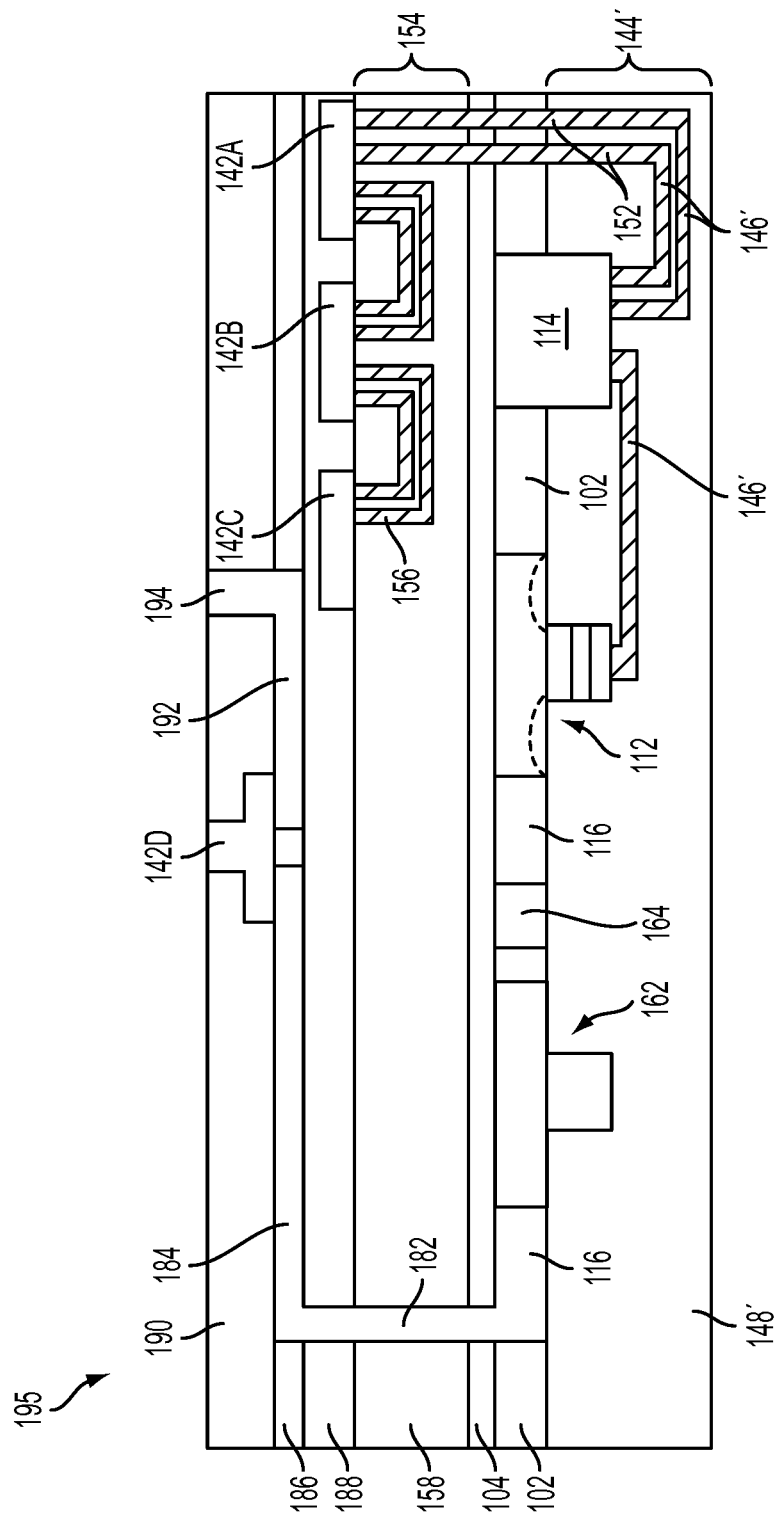
FIG. 9 is a simplified and schematically illustrated cross-sectional side view illustrating another three-dimensionally integrated semiconductor system similar to that of FIG. 8, but further comprising an additional photoactive device fabricated on the SeOI substrate and operatively coupled with the first photoactive device as illustrated in FIG. 6.

FIG. 9 illustrates a three-dimensionally integrated semiconductor system 195 that is generally similar to the three-dimensionally integrated semiconductor system 180 of FIG. 8, and includes a photoactive device 112, a current/voltage converter 114, and a waveguide 116 disposed over the layer of semiconductor material 102 and the layer of electrically insulating material 104. The three-dimensionally integrated semiconductor system 195 also includes an additional photoactive device 162 that is operatively coupled with the first photoactive device 112, and an optional modulator 164, as previously described with reference to FIG. 6. For example, the additional photoactive device 162 may comprise a photoemitter that is configured to emit electromagnetic radiation. A waveguide 166 may extend from the additional photoactive device 162 to the modulator 164, and the waveguide 116 may extend from the modulator 164 to the first photoactive device 112, which may comprise a photodetector configured to receive the modulated electromagnetic radiation.

The three-dimensionally integrated semiconductor system 195 may further comprise a plurality of optical interconnects configured to convey electromagnetic radiation between the additional photoactive device 162 and the at least one photoactive device 112 formed on the layer of semiconductor material 102 of the SeOI substrate 100 (FIG. 1), as well as between the additional photoactive device 162 and any other optical component of the three-dimensionally integrated semiconductor system 195. The plurality of optical interconnects may include, for example, the waveguide 116 that comprises a portion of the layer of semiconductor material 102 of the SeOI substrate 100, as previously described with reference to FIGS. 2 and 3. The plurality of optical interconnects may include at least one through wafer optical interconnect 182 that extends vertically through the three-dimensionally integrated semiconductor system 195 (from the perspective of FIG. 9) in a direction perpendicular to the layer of semiconductor material 102 and the layer of electrically insulating material 104. One end of the through wafer optical interconnect 182 may extend to and be operatively coupled with the waveguide 116, and an opposing end of the through wafer optical interconnect 182 may be operatively coupled another waveguide optical device (not shown).

Although not specifically illustrated in the schematically illustrated figures, various components of photonic integrated circuits are known in the art, including, for example, ring resonators, Mach-Zender (MZ) interferometers, arrayed waveguide grating (AWG) multiplexers and demultiplexers, and delay lines. Such components also may be included in the three-dimensionally integrated semiconductor systems previously described herein, and may be formed on the SeOI substrate 100. Further, such components may be optically coupled with one another using optical interconnects as previously described herein.

The three-dimensionally integrated semiconductor systems previously described herein may be configured as any of a number of different types of optical or optoelectronic systems. As non-limiting examples, the three-dimensionally integrated semiconductor systems may be configured as and comprise an electromagnetic radiation transmitter configured to output an electromagnetic radiation signal responsive to an electrical signal input, and/or an electromagnetic radiation receiver configured to output an electrical signal responsive to an electromagnetic radiation signal input. Thus, in some embodiments, the three-dimensionally integrated semiconductor systems may comprise an electromagnetic radiation transceiver configured to output an electromagnetic radiation signal responsive to an electrical signal input, and to output an electrical signal responsive to an electromagnetic radiation signal input.

Figure 10:
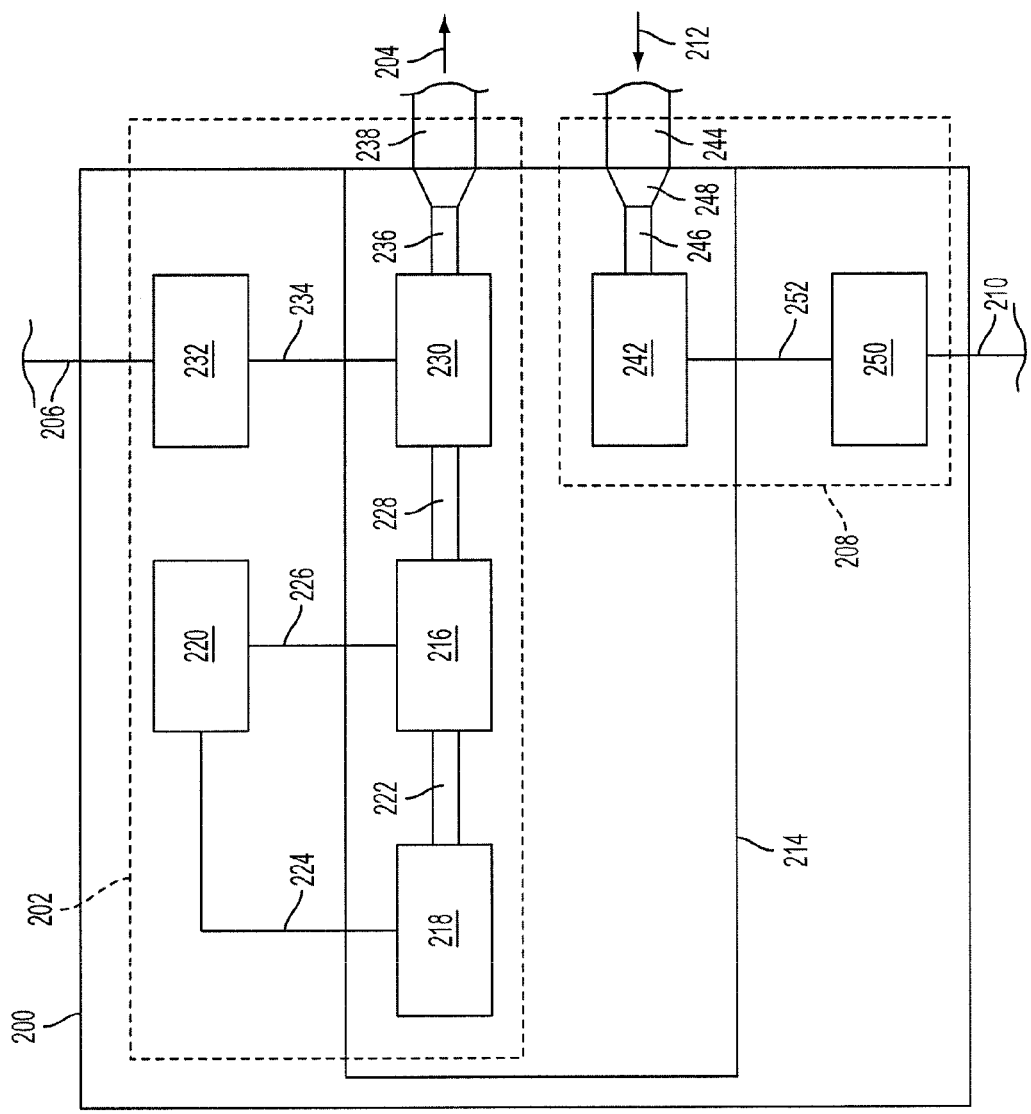
FIG. 10 is a simplified schematic diagram of a three-dimensionally integrated semiconductor system comprising an electromagnetic transceiver.

FIG. 10 is a schematic diagram of a three-dimensionally integrated semiconductor system 200 comprising an electromagnetic transceiver. The transceiver includes an electromagnetic radiation transmitter 202 configured to output an electromagnetic radiation signal 204 responsive to an electrical signal input 206, and an electromagnetic radiation receiver 208 configured to output an electrical signal 210 responsive to an electromagnetic radiation signal input 212. Thus, the three-dimensionally integrated semiconductor system 200 includes both electrical components, and optical and/or optoelectronic components, as do the previously described three-dimensionally integrated semiconductor systems. The optical and/or optoelectronic components of the three-dimensionally integrated semiconductor system 200 are those enclosed within the box 214 in FIG. 10. The components of the three-dimensionally integrated semiconductor system 200 outside the box 214 are electrical components.

As shown in FIG. 10, the electromagnetic radiation transmitter 202 includes an electromagnetic radiation emitter 216 (e.g., a laser), a monitoring photodetector 218 for monitoring the electromagnetic radiation emitted by the emitter 216, and a driver device 220 (e.g., a laser driver) for controlling operation of the emitter 216. The emitter 216, the monitoring photodetector 218, and the driver device 220 may have a closed loop configuration, wherein a waveguide 222 is used to convey electromagnetic radiation emitted by the emitter 216 to the monitoring photodetector 218, at least one electrical pathway 224 extends between and electrically couples the monitoring photodetector 218 and the driver device 220 for allowing the driver device 220 to receive an input electrical signal (generated by the monitoring photodetector 218) characteristic of the electromagnetic radiation emitted by the emitter 216, and at least one electrical pathway 226 extends between and electrically couples the driver device 220 and the emitter 216 for allowing the driver device 220 to control operation of the emitter 216.

Another waveguide 228 extends from the emitter 216 to an electro-optic modulator 230. The electro-optic modulator 230 may be used to selectively modulate the electromagnetic radiation emitted by the emitter 216 responsive to the electrical signal input 206. Another driver device 232 may be used to control operation of the electro-optic modulator 230 responsive to the electrical signal input 206. The driver device 232 may comprise a radio frequency (RF) circuit capable of generating a radio frequency signal from the electrical signal input 206, which is to be conveyed to the electro-optic modulator 230 through at least one electrical pathway 234.

The modulated electromagnetic radiation may be conveyed away from the electro-optic modulator 230 by a waveguide 236, which, optionally, may be coupled with a fiber-optic conduit by way of a waveguide-to-fiber coupler 240.

The electromagnetic radiation receiver 208 includes a photodetector 242 for receiving and detecting the electromagnetic radiation signal input 212. The electromagnetic radiation signal input 212 may be conveyed to the photodetector 242 through another fiber-optic conduit 244 and a waveguide 246, which may be coupled together by a waveguide-to-fiber coupler 248. The photodetector 242 may be configured to generate electrical current responsive to impingement of the electromagnetic radiation signal input 212 thereon. The electrical current generated by the photodetector 242 may be conveyed to a current/voltage converter 250 through an electrical pathway 252. The current/voltage converter 250 may comprise a transimpedance amplifier configured to generate a voltage signal output responsive to the electrical current input generated by and received from the photodetector 242 through the electrical pathway 252. The electrical signal output 210 may comprise the voltage signal generated by the current/voltage converter 250.

Any of the previously described three-dimensionally integrated semiconductor systems 140, 150, 160, 180 may be configured to comprise a three-dimensionally integrated semiconductor system 200 as schematically illustrated in FIG. 10.

Additional non-limiting example embodiments of the invention are described below.

Embodiment 1

A three-dimensionally integrated semiconductor system, comprising: a semiconductor-on-insulator (SeOI) substrate comprising: a layer of semiconductor material; and a layer of electrically insulating material disposed adjacent a major surface of the layer of semiconductor material; at least one photoactive device formed on the layer of semiconductor material of the SeOI substrate; and at least one optical interconnect comprising a portion of the layer of semiconductor material of the SeOI substrate, the at least one optical interconnect operatively coupled to the at least one photoactive device; at least one current/voltage converter formed over the layer of semiconductor material of the SeOI substrate; at least one electrical pathway extending between the at least one photoactive device and the at least one current/voltage converter; at least one semiconductor device bonded over the SeOI substrate; and at least one electrical pathway extending between the at least one current/voltage converter and the at least one semiconductor device bonded over the SeOI substrate.

Embodiment 2

The three-dimensionally integrated semiconductor system of Embodiment 1, wherein the at least one photoactive device and the at least one semiconductor device bonded over the SeOI substrate are disposed on a common side of the layer of electrically insulating material of the SeOI substrate.

Embodiment 3

The three-dimensionally integrated semiconductor system of Embodiment 2, wherein the at least one current/voltage converter is disposed on the common side of the layer of electrically insulating material of the SeOI substrate.

Embodiment 4

The three-dimensionally integrated semiconductor system of Embodiment 1, wherein the at least one photoactive device and the at least one semiconductor device bonded over the SeOI substrate are disposed on opposing sides of the layer of electrically insulating material of the SeOI substrate.

Embodiment 5

The three-dimensionally integrated semiconductor system of Embodiment 4, wherein the at least one photoactive device and the at least one current/voltage converter are disposed on a common side of the layer of electrically insulating material of the SeOI substrate.

Embodiment 6

The three-dimensionally integrated semiconductor system of any one of Embodiments 1 through 5, wherein the at least one photoactive device comprises a photodetector configured to generate electrical current responsive to impingement of electromagnetic radiation on the photodetector.

Embodiment 7

The three-dimensionally integrated semiconductor system of Embodiment 6, wherein the at least one optical interconnect is configured to convey electromagnetic radiation to the photodetector.

Embodiment 8

The three-dimensionally integrated semiconductor system of Embodiment 6, wherein the at least one current/voltage converter comprises a transimpedance amplifier.

Embodiment 9

The three-dimensionally integrated semiconductor system of any one of Embodiments 1 through 8, wherein the at least one photoactive device comprises a photoemitter configured to generate an electromagnetic radiation signal responsive to an electrical signal input.

Embodiment 10

The three-dimensionally integrated semiconductor system of Embodiment 9, wherein the at least one optical interconnect is configured to convey electromagnetic radiation emitted by the photoemitter.

Embodiment 11

The three-dimensionally integrated semiconductor system of Embodiment 9 or Embodiment 10, wherein the photoemitter comprises a germanium-on-silicon emitter.

Embodiment 12

The three-dimensionally integrated semiconductor system of any one of Embodiments 1 through 11, wherein the at least one semiconductor device bonded over the SeOI substrate comprises an electronic signal processor.

Embodiment 13

The three-dimensionally integrated semiconductor system of Embodiment 12, wherein the at least one semiconductor device bonded over the SeOI substrate comprises a plurality of semiconductor devices bonded over the SeOI substrate.

Embodiment 14

The three-dimensionally integrated semiconductor system of Embodiment 13, wherein at least one semiconductor device of the plurality of semiconductor devices bonded over the SeOI substrate comprises an electronic memory device.

Embodiment 15

The three-dimensionally integrated semiconductor system of any one of Embodiments 1 through 11, wherein the at least one semiconductor device bonded over the SeOI substrate comprises a plurality of semiconductor devices bonded over the SeOI substrate.

Embodiment 16

The three-dimensionally integrated semiconductor system of Embodiment 15, wherein at least one semiconductor device of the plurality of semiconductor devices bonded over the SeOI substrate comprises an additional photoactive device.

Embodiment 17

The three-dimensionally integrated semiconductor system of Embodiment 16, wherein the additional photoactive device is operatively coupled with the at least one photoactive device formed on the layer of semiconductor material of the SeOI substrate.

Embodiment 18

The three-dimensionally integrated semiconductor system of Embodiment 17, further comprising a plurality of optical interconnects configured to convey electromagnetic radiation between the additional photoactive device and the at least one photoactive device fainted on the layer of semiconductor material of the SeOI substrate, the plurality of optical interconnects comprising the at least one waveguide comprising the portion of the layer of semiconductor material of the SeOI substrate.

Embodiment 19

The three-dimensionally integrated semiconductor system of Embodiment 18, wherein the plurality of optical interconnects comprises at least one through wafer optical interconnect.

Embodiment 20

The three-dimensionally integrated semiconductor system of any one of Embodiments 17 through 19, wherein the additional photoactive device comprises a photoemitter configured to emit electromagnetic radiation, and the at least one photoactive device formed on the layer of semiconductor material of the SeOI substrate comprises a photodetector configured to detect emission of electromagnetic radiation emitted by the photoemitter.

Embodiment 21

The three-dimensionally integrated semiconductor system of Embodiment 20, wherein the photoemitter comprises a laser device.

Embodiment 22

The three-dimensionally integrated semiconductor system of Embodiment 20, wherein the photoemitter comprises a germanium-on-silicon emitter device.

Embodiment 23

The three-dimensionally integrated semiconductor system of any one of Embodiments 1 through 22, wherein the three-dimensionally integrated semiconductor system comprises an electromagnetic radiation transmitter configured to output an electromagnetic radiation signal responsive to an electrical signal input.

Embodiment 24

The three-dimensionally integrated semiconductor system of any one of Embodiments 1 through 22, wherein the three-dimensionally integrated semiconductor system comprises an electromagnetic radiation receiver configured to output an electrical signal responsive to an electromagnetic radiation signal input.

Embodiment 25

The three-dimensionally integrated semiconductor system of Embodiment 23 or Embodiment 24, wherein the three-dimensionally integrated semiconductor system comprises an electromagnetic radiation transceiver configured to output an electromagnetic radiation signal responsive to an electrical signal input, and to output an electrical signal responsive to an electromagnetic radiation signal input.

Embodiment 26

A method of fabricating a three-dimensionally integrated semiconductor system, comprising: forming at least one photoactive device on a layer of semiconductor material of a semiconductor-on-insulator (SeOI) substrate; forming at least one waveguide comprising a portion of the layer of semiconductor material of the SeOI substrate, and operatively coupling the at least one waveguide with the at least one photoactive device; forming at least one current/voltage converter over the layer of semiconductor material of the SeOI substrate; electrically coupling the at least one photoactive device and the at least one current/voltage converter; bonding at least one semiconductor device over the SeOI substrate; and electrically coupling the at least one current/voltage converter and the at least one semiconductor device bonded over the SeOI substrate.

Embodiment 27

The method of Embodiment 26, further comprising forming the at least one photoactive device on a first side of a layer of electrically insulating material of the SeOI substrate, and bonding the at least one semiconductor device bonded over the first side of the layer of electrically insulating material of the SeOI substrate.

Embodiment 28

The method of Embodiment 27, further comprising at least one of forming the at least one current/voltage converter on the first side of the layer of electrically insulating material of the SeOI substrate and bonding the at least one current/voltage converter over the first side of the layer of electrically insulating material of the SeOI substrate.

Embodiment 29

The method of Embodiment 26, wherein forming the at least one photoactive device comprises forming a photodetector configured to generate electrical current responsive to impingement of electromagnetic radiation on the photodetector.

Embodiment 30

The method of any one of Embodiments 26 through 29, wherein forming the at least one current/voltage converter comprises forming a transimpedance amplifier.

Embodiment 31

The method of any one of Embodiments 26 through 30, wherein forming the at least one photoactive device comprises forming a photoemitter configured to generate an electromagnetic radiation signal responsive to an electrical signal input.

Embodiment 32

The method of Embodiment 31, wherein forming the photoemitter comprises forming a laser device configured to emit at least substantially coherent electromagnetic radiation responsive to the electrical signal input.

Embodiment 33

The method of Embodiment 31 or Embodiment 32, wherein forming the photoemitter comprises forming a germanium-on-silicon emitter.

Embodiment 34

The method of any one of Embodiments 26 through 33, wherein bonding at least one semiconductor device over the SeOI substrate comprises bonding an electronic signal processor over the SeOI substrate.

Embodiment 35

The method of any one of Embodiments 26 through 34, wherein bonding at least one semiconductor device over the SeOI substrate further comprises bonding an electronic memory device over the SeOI substrate.

Embodiment 36

The method of any one of Embodiments 26 through 35, wherein bonding at least one semiconductor device over the SeOI substrate comprises bonding a plurality of semiconductor devices over the SeOI substrate.

Embodiment 37

The method of Embodiment 36, wherein bonding the plurality of semiconductor devices over the SeOI substrate comprises providing an additional photoactive device over the SeOI substrate.

Embodiment 38

The method of Embodiment 37, further comprising operatively coupling the additional photoactive device with the at least one photoactive device formed on the layer of semiconductor material of the SeOI substrate.

Embodiment 39

The method of Embodiment 37 or Embodiment 38, further comprising selecting the additional photoactive device to comprise a photoemitter configured to emit electromagnetic radiation, and selecting the at least one photoactive device formed on the layer of semiconductor material of the SeOI substrate to comprise a photodetector configured to detect emission of electromagnetic radiation emitted by the photoemitter.

Embodiment 40

The method of Embodiment 39, further comprising selecting the photoemitter to comprise a germanium-on-silicon emitter device.

Embodiment 41

The method of any one of Embodiments 26 through 40, further comprising configuring the three-dimensionally integrated semiconductor system to comprise at least one of an electromagnetic radiation transmitter configured to output an electromagnetic radiation signal responsive to an electrical signal input, and an electromagnetic radiation receiver configured to output an electrical signal responsive to an electromagnetic radiation signal input.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A three-dimensionally integrated semiconductor system, comprising:
    a semiconductor-on-insulator (SeOI) substrate comprising:
        a layer of semiconductor material; and
        a layer of electrically insulating material disposed adjacent a major surface of the layer of semiconductor material;
    at least one photoactive device formed on the layer of semiconductor material of the SeOI substrate; and
    at least one optical interconnect comprising a portion of the layer of semiconductor material of the SeOI substrate, the at least one optical interconnect operatively coupled to the at least one photoactive device;
    at least one current/voltage converter formed over the layer of semiconductor material of the SeOI substrate;
    at least one electrical pathway extending between the at least one photoactive device and the at least one current/voltage converter;
    at least one semiconductor device directly bonded over the SeOI substrate by a direct bonding process, wherein the at least one semiconductor device and the at least one photoactive device are disposed on opposing sides of the layer of electrically insulating material of the SeOI substrate; and
    at least one electrical pathway extending between the at least one current/voltage converter and the at least one semiconductor device bonded over the SeOI substrate.

2. A three-dimensionally integrated semiconductor system, comprising:
    a semiconductor-on-insulator (SeOI) substrate comprising:
        a layer of semiconductor material; and
        a layer of electrically insulating material disposed adjacent a major surface of the layer of semiconductor material;
    at least one photoactive device formed on the layer of semiconductor material of the SeOI substrate; and
    at least one optical interconnect comprising a portion of the layer of semiconductor material of the SeOI substrate, the at least one optical interconnect operatively coupled to the at least one photoactive device;
    at least one current/voltage converter formed over the layer of semiconductor material of the SeOI substrate;
    at least one electrical pathway extending between the at least one photoactive device and the at least one current/voltage converter;
    at least one semiconductor device directly bonded over the SeOI substrate by a direct bonding process, wherein the at least one photoactive device and the at least one semiconductor device bonded over the SeOI substrate are disposed on a common side of the layer of electrically insulating material of the SeOI substrate; and
    at least one electrical pathway extending between the at least one current/voltage converter and the at least one semiconductor device bonded over the SeOI substrate.

3. The three-dimensionally integrated semiconductor system of claim 2, wherein the at least one current/voltage converter is disposed on the common side of the layer of electrically insulating material of the SeOI substrate.

4. The three-dimensionally integrated semiconductor system of claim 1, wherein the at least one photoactive device and the at least one current/voltage converter are disposed on a common side of the layer of electrically insulating material of the SeOI substrate.

5. The three-dimensionally integrated semiconductor system of claim 1, wherein the at least one photoactive device comprises a photodetector configured to generate electrical current responsive to impingement of electromagnetic radiation on the photodetector.

6. The three-dimensionally integrated semiconductor system of claim 5, wherein the at least one optical interconnect is configured to convey electromagnetic radiation to the photodetector.

7. The three-dimensionally integrated semiconductor system of claim 5, wherein the at least one current/voltage converter comprises a transimpedance amplifier.

8. The three-dimensionally integrated semiconductor system of claim 1, wherein the at least one photoactive device comprises a photoemitter configured to generate an electromagnetic radiation signal responsive to an electrical signal input.

9. The three-dimensionally integrated semiconductor system of claim 8, wherein the at least one optical interconnect is configured to convey electromagnetic radiation emitted by the photoemitter.

10. The three-dimensionally integrated semiconductor system of claim 8, wherein the photoemitter comprises a germanium-on-silicon emitter.

11. The three-dimensionally integrated semiconductor system of claim 1, wherein the at least one semiconductor device bonded over the SeOI substrate comprises an electronic signal processor.

12. The three-dimensionally integrated semiconductor system of claim 11, wherein the at least one semiconductor device bonded over the SeOI substrate comprises a plurality of semiconductor devices bonded over the SeOI substrate.

13. The three-dimensionally integrated semiconductor system of claim 12, wherein at least one semiconductor device of the plurality of semiconductor devices bonded over the SeOI substrate comprises an electronic memory device.

14. The three-dimensionally integrated semiconductor system of claim 1, wherein the at least one semiconductor device bonded over the SeOI substrate comprises a plurality of semiconductor devices bonded over the SeOI substrate.

15. The three-dimensionally integrated semiconductor system of claim 14, wherein at least one semiconductor device of the plurality of semiconductor devices bonded over the SeOI substrate comprises an additional photoactive device.

16. The three-dimensionally integrated semiconductor system of claim 15, wherein the additional photoactive device is operatively coupled with the at least one photoactive device formed on the layer of semiconductor material of the SeOI substrate.

17. The three-dimensionally integrated semiconductor system of claim 16, further comprising a plurality of optical interconnects configured to convey electromagnetic radiation between the additional photoactive device and the at least one photoactive device formed on the layer of semiconductor material of the SeOI substrate, the plurality of optical interconnects comprising the at least one waveguide comprising the portion of the layer of semiconductor material of the SeOI substrate.

18. The three-dimensionally integrated semiconductor system of claim 17, wherein the plurality of optical interconnects comprises at least one through wafer optical interconnect.

19. The three-dimensionally integrated semiconductor system of claim 16, wherein the additional photoactive device comprises a photoemitter configured to emit electromagnetic radiation, and the at least one photoactive device formed on the layer of semiconductor material of the SeOI substrate comprises a photodetector configured to detect emission of electromagnetic radiation emitted by the photoemitter.

20. The three-dimensionally integrated semiconductor system of claim 19, wherein the photoemitter comprises a laser device.

21. The three-dimensionally integrated semiconductor system of claim 19, wherein the photoemitter comprises a germanium-on-silicon emitter device.

22. The three-dimensionally integrated semiconductor system of claim 1, wherein the three-dimensionally integrated semiconductor system comprises an electromagnetic radiation transmitter configured to output an electromagnetic radiation signal responsive to an electrical signal input.

23. The three-dimensionally integrated semiconductor system of claim 1, wherein the three-dimensionally integrated semiconductor system comprises an electromagnetic radiation receiver configured to output an electrical signal responsive to an electromagnetic radiation signal input.

24. The three-dimensionally integrated semiconductor system of claim 1, wherein the three-dimensionally integrated semiconductor system comprises an electromagnetic radiation transceiver configured to output an electromagnetic radiation signal responsive to an electrical signal input, and to output an electrical signal responsive to an electromagnetic radiation signal input.

* * * * *